United States Patent
Uzoh et al.

(10) Patent No.: US 6,572,982 B1
(45) Date of Patent: Jun. 3, 2003

(54) ELECTROMIGRATION-RESISTANT COPPER MICROSTRUCTURE

(75) Inventors: Cyprian E. Uzoh, Beacon, NY (US); Steven H. Boettcher, Fishkill, NY (US); Patrick W. DeHaven, Poughkeepsie, NY (US); Christopher C. Parks, Beacon, NY (US); Andrew H. Simon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 09/604,539

(22) Filed: Jun. 27, 2000

Related U.S. Application Data (62) Division of application No. 09/203,926, filed on Dec. 2, 1998, now Pat. No. 6,123,825.

(51) Int. Cl.[7] .................. B32B 15/04; B32B 15/20; B32B 15/01
(52) U.S. Cl. .................. 428/675; 428/621; 428/637
(58) Field of Search .................. 428/674, 675, 428/676, 677, 671, 686, 687, 621, 622, 623, 612, 610, 636, 637; 205/183, 184, 224, 118, 210, 222, 220; 438/687, 644, 685

(56) References Cited

U.S. PATENT DOCUMENTS

| | | | |
|---|---|---|---|
| 4,640,745 A | * 2/1987 | Knothe et al. ............ 204/5 |
| 4,661,416 A | 4/1987 | Mizuhara .................. 428/606 |
| 4,814,049 A | 3/1989 | Helton et al. ............. 205/50 |
| 5,071,518 A | 12/1991 | Pan ........................ 205/122 |
| 5,098,860 A | 3/1992 | Chakravorty et al. ....... 438/628 |
| 5,106,461 A | 4/1992 | Volfson et al. ............ 205/125 |
| 5,213,638 A | 5/1993 | Mahulikar et al. ......... 148/627 |
| 5,308,796 A | 5/1994 | Feldman et al. ........... 438/655 |
| 5,320,689 A | 6/1994 | Mahulikar et al. ......... 148/436 |
| 5,385,661 A | 1/1995 | Andricacos et al. ........ 205/239 |
| 5,792,565 A | 8/1998 | Cupolo et al. ............ 428/672 |
| 5,933,758 A | 8/1999 | Jain ....................... 438/687 |
| 5,989,727 A | * 11/1999 | Yates et al. ............. 428/607 |
| 6,001,744 A | 12/1999 | Doi ....................... 438/745 |
| 6,022,808 A | * 2/2000 | Nogami et al. ........... 438/694 |
| 6,197,181 B1 | * 3/2001 | Chen ...................... 205/123 |
| 6,333,120 B1 | * 12/2001 | DeHaven et al. ......... 428/615 |
| 6,380,627 B1 | * 4/2002 | Weihs et al. ............. 257/762 |

FOREIGN PATENT DOCUMENTS

JP 64-64338 3/1989

* cited by examiner

Primary Examiner—Michael La Villa
(74) Attorney, Agent, or Firm—Ratner & Prestia (57) ABSTRACT

An electromigration-resistant copper film structure and the process for forming the structure. The film structure contains a high impurity content, is resistant to grain growth, and possesses superior metallurgical, thermo-mechanical, and electrical properties. The process comprises the steps of: (a) providing a seed layer at least indirectly on a substrate, the seed layer having an exposed surface; (b) immersing the substrate in a plating solution; (c) electrodepositing a copper-containing film on the exposed surface of the seed layer, the copper-containing film having a first surface; (d) maintaining the substrate in an immersed state within the plating solution; (e) electrodepositing a further copper-containing film from the plating solution onto the first surface; (f) removing the substrate from the plating solution; and (g) drying the substrate.

6 Claims, 7 Drawing Sheets

ELECTROMIGRATION-RESISTANT COPPER MICROSTRUCTURE

This application is a divisional of U.S. patent application Ser. No. 09/203,926, filed on Dec. 2, 1998, now U.S. Pat. No. 6,123,825.

FIELD OF THE INVENTION

The present invention relates to a process for suppressing the onset of room temperature grain growth and instability in electrodeposited metals used in semiconductor chips and packages. More particularly, the present invention provides a process for enhancing the electromigration resistance of electroplated metal such as copper by enhancing the microstructure of electroplated metal used in chip wiring and packaging applications.

BACKGROUND OF THE INVENTION

The thermo-mechanical and metallurgical properties, microstructure, and etching characteristics of a plated copper film depend on the electroplating process used to produce the film. More specifically, these qualities depend upon bath additives, nature of agitation, filtration, current density, and the nature of the electrical contacts used to form the film. The microstructure of plated metals such as copper or gold is known to be unstable at room temperature. Room temperature grain recovery and grain growth processes are difficult to control, yet must be suppressed.

Uncontrolled grain recovery and grain growth may cause defects during subsequent processes. For example, the step of etching a plated metal film surface during the grain growth period may result in the etchant species selectively attacking the active grain boundaries. Thus, the grain boundary regions are etched faster than desired. The resulting rough metal surface may present difficulties in subsequent processes, such as forming another film on the metal film surface. A dielectric film may be deposited onto the metal film surface, for example, in a common device application. A rough metal surface may present difficulties in obtaining the desired qualities of the dielectric film being deposited over the etched copper. For example, when the film thickness of the dielectric film is being monitored as deposited using ellipsometric processes, the accuracy of the ellipsometric monitoring is reduced due to anomalous scattering from the highly decorated grains. This reduced accuracy is particularly troublesome when the dimensions of the grains of the plated film are comparable to those of the wavelength of the light used in the optical data collection.

It is also known that the impurity content of deposited metal films depends strongly on the concentration of additives in the plating formulation used in the plating bath. For example, to obtain a specific, desired amount of impurity such as carbon, oxygen, nitrogen, or sulfur, in a plated film, the impurity concentration in the bath formulation must be within a tight range. In order to increase or decrease the amount of impurities produced in the plated film, a different bath formulation normally is required: a bath formulation that contains a correspondingly increased or decreased amount of impurity additives.

What is needed is an improved process for producing an electrodeposited metal film with increased impurity content, such that the impurity content will be nearly independent of the concentration of bath additives. Thus, such a process is one object of the present invention. Another object of the present invention is a process which has suppressed grain growth characteristics. A related object is to provide a process yielding an electrodeposited metal film which has superior metallurgical, electrical, and thermo-mechanical properties.

SUMMARY OF THE INVENTION

To achieve these and other objects, and in view of its purposes, the present invention provides a process to suppress the onset of grain growth within an electroplated film before metal etching. Suppressed grain growth or "recrystallization" provides films with superior metallurgical, electrical, and thermo-mechanical properties. The present invention is also directed to a process for producing an electroplated film having an impurity level which is increased relative to that of the prior art, when both the prior art film and the film of the present invention are produced from a bath with an identical impurity concentration.

The present invention is also directed to a process of increasing the amount of overall impurity content in an electroplated film from nominal amounts to much higher levels without modifying or changing the bath formulation used in the electroplating process. The impurity level, more specifically, a laminated impurity layer added to the film, is sufficient to stabilize the microstructure of the plated film and to aid in suppressing grain growth, as described above, but not so high as to create a multi-layer contact resistance problem. The present invention provides a method for laminating impurities into a metal film within a discrete region having a higher impurity concentration than that of a bulk film electrodeposited from the same solution. Therefore, the present invention provides a process for producing an electroplated copper film with an increased resistance to grain growth and which has a higher impurity content than previously obtainable from a bath with a given impurity concentration.

The process of the present invention comprises the steps of: (a) providing a seed layer at least indirectly on a substrate, the seed layer having an exposed surface; (b) immersing the substrate in a plating solution; (c) electrodepositing a copper-containing film on the exposed surface of the seed layer, the copper-containing film having a first surface; (d) maintaining the substrate in an immersed state within the plating solution; (e) electrodepositing a further copper-containing film from the plating solution onto the first surface; (f) removing the substrate from the plating solution; and (g) drying the substrate.

BRIEF DESCRIPTION OF THE DRAWING

The present invention is best understood from the following detailed description when read in connection with accompanying drawing. It is emphasized that, according to common practice, the various features of the drawing are not to scale. On the contrary, the dimensions of the various features are arbitrary expanded or reduced for clarity. Included in the drawing are the following figures. In general, FIGS. 1A through 7A represent a surface metal line, formed according to the process of the present invention, and FIGS. 1B through 7B represent a damascene metal line also formed according to the process of the present invention.

DETAILED DESCRIPTION OF THE INVENTION

The process of the present invention is directed generally to electroplating multiple films in sequence to form a single, composite film structure. The surface formed between the films deposited in sequence may be treated so that a microstructure is formed on the surface. In addition, a film with a high impurity content may be laminated onto the microstructures of the surfaces which form the interface between the sequentially deposited films. The microstructure formed on the surface of the films and the high impurity-content films laminated in between them both work to suppress grain growth within the electrodeposited film at room temperature. Room temperature grain growth in electro-deposited films brings about thermo-mechanical problems, metallurgical problems, and problems in subsequent etching operations.

The presence of impurities laminated in plated films retards the onset of room temperature grain growth. The plated film is stabilized, such that the time required for grain growth initiation is prolonged from the typical value of six to twelve hours to periods ranging from 3 to 5 days for minor or direct lamination and up to 30 days for major or indirect lamination. When a film with impurities laminated within it is subsequently annealed, a highly twinned grain structure results. Such a grain structure produces an extremely stable microstructure that is resistant to subsequent grain growth.

In the etching of plated films, it is often more desirable to etch plated copper with very fine grains (grain sizes less than 200 nm) because of the excellent etching characteristics associated with fine-grain etching. The problems associated with etching a film during the grain growth process are as follows. When grain growth occurs, the grains become larger and more distinctive, and grain boundaries become more clearly defined and more pronounced. Films with these characteristics do not etch uniformly; rather, they etch preferentially along the grain boundaries. Hence, retarding the onset of grain growth at room temperature before metal etching is desirable.

In addition to imparting very desirable etching characteristics to the plated film, a process that maintains a fine-grain structure also improves the mechanical strength of the plated film as well as other metallurgical and electrical qualities. The processes of the present invention achieve impurity lamination within the composite electroplated film and form surfaces containing microstructures within the composite electroplated film. These processes maintain the desirable fine grain structure.

In one embodiment of the present invention, the film formation process includes: plating a copper film; spinning the plating solution off the surface of the substrate in an $O_2$ ambient to form a microstructure within the surface; allowing the substrate to dwell in the electroplating solution without current being applied in order to laminate an impurity film onto the microstructure; and plating an additional copper film to complete the film deposition process. In an alternative embodiment, the process includes plating a copper film, allowing the substrate to dwell in the plating solution without current being applied for a longer dwell time then used in the first embodiment during which time impurity adsorption and the creation of a laminated impurity film occurs, and then plating an additional copper film to complete the film deposition. In both of the above embodiments, an annealing process may follow to promote twinning within the grain structure.

A third embodiment of the process of the present invention is especially applicable when a highly twinned grained structure is desired. This embodiment includes plating, laminating an impurity film, and annealing. In a fourth embodiment of the present invention, applicable when increased grain growth is desired, the process includes plating, modifying the surface by etching to expose crystallographic planes, and annealing.

The process of the present invention is used to form an electrodeposited film on a substrate. In an exemplary embodiment, the substrate may be a semiconductor wafer. A plating base is first formed on the substrate. An example of a plating base may be a copper seed layer ranging from 100 to 2,500 Angstroms in thickness, more preferably in the range of 200 to 1,500 Angstroms in the preferred embodiment. The plating base seed layer may be formed on the substrate using any process suitable in the art, such as sputtering. In an alternative embodiment, the substrate may also include a barrier material interposed between a dielectric film formed on the substrate and the plating base. In this alternative embodiment, the copper seed layer or other plating base is formed upon the barrier layer. The substrate is then plated in a copper plating bath containing suitable additives to form an electromigration-resistant plated copper film according to the process of the present invention, in which grain growth is suppressed.

After the barrier layer and the copper seed layer are formed on the semiconductor substrate, the substrate requires an initial cleaning operation. The necessity of the cleaning operation is determined by the cleanliness of the substrate and also the seed layer thickness; the seed layer will be partially etched during the cleaning operation. The semiconductor substrate may be cleaned by etching in a sulfuric acid solution. The sulfuric acid concentration of the cleaning solution may range from 1% to 15% sulfuric acid in de-ionized water, but preferably may be in the range of 2 to 8%. The immersion time in the sulfuric acid solution may vary from 0 to 30 seconds, most preferably from 0 to 10 seconds. This immersion is followed by rinsing in de-ionized water before the formation of the electrodeposited metal film. When the seed layer is thin and the substrate is already sufficiently clean, this pre-cleaning step before electroplating is not necessary.

After this cleaning procedure is completed, the substrate is immersed in a plating cell in which the plating solution may be agitated with respect to the substrate. The substrate may be exposed to the plating solution for a brief period of time before the application of an electrical potential to the substrate. This brief dwell time may vary from 0 to 20 seconds but, in the preferred embodiment, may be within the range of 0 to 10 seconds. During this time period, the substrate may be preferably rotated at 10 to 400 rpm.

When an acid copper plating bath is used, in addition to the copper sulfate pentahydrate and sulfuric acid, other additives may be included such as chlorine ions, MD, $ML_o$, and other plating bath additives. MD and $ML_o$ are plating bath additives available from OMI-Enthone, Inc. and which are commonly used in the plating industry. The copper sulfate pentahydrate concentration within the solution may vary from 20 to 130 grams/liter. In the preferred embodiment, the concentration range lies within 35 to 110 grams/liter. The sulfuric acid content of the bath may range from 100 to 230 grams/liter and, in the preferred embodiment, the sulfuric acid content ranges from 150 to 210 grams/liter.

With respect to chlorine ions as additives, the plating bath concentration may vary from 25 to 180 parts per million, and lies within the range of 45 to 130 parts per million in the preferred embodiment. With respect to additive MD, the concentration may range from 2 to 18 millimeters/liter and, in the preferred embodiment, is within the range of 4 to 16 millimeters/liter. With respect to the concentration of additive $ML_o$ within the bath, the concentration range of the preferred embodiment will be between 0.2 to 3.5 millimeters/liter, but may range from 0.3 to 4.5 millimeters/liter.

After the brief dwell period within the plating solution, the plating process is initiated. During the plating process, the electroplating current density may range from 5 to 60 $mA/cm^2$. In the preferred embodiment, this current density may range from 10 to 40 $mA/cm^2$ and most desirably within the range of 10 to 30 $mA/cm^2$. The anode material used may consist of a CuP alloy, as typically used in copper electrodeposition. The plating surface of the substrate may be plated facing downward or vertically, and rotation may be used as an additional source of agitation during the electroplating process. The substrate may be rotated at a rate of 10 to 500 rpm, but most preferably within the range of 10 to 180 rpm. In the preferred embodiment, the desired rotation rate will range from 30 to 120 rpm during the plating operation. The electrodeposition is carried out by rendering the substrate a cathode for 5 to 40 seconds, preferably 5 to 30 seconds, to form an electroplated film which will comprise one layer of the composite film of the present invention.

The formation of the composite film of the present invention is continued by removing the substrate from the plating solution and placing the substrate in an oxygen containing atmosphere, such as air. This may not be necessary if an oxygen source is included in the plating bath. The partially plated substrate is next spun at a rate of 20 to 1,800 rpm, preferably in the range of 300 to 1,200 rpm. The spin time may range from 5 to 60 seconds and, in the preferred embodiment, may be 10 to 50 seconds. This operation spins the plating solution off the substrate surface. The operation also simultaneously etches a unique microstructure onto the substrate surface. The presence of oxygen in the ambient environment, within which this spinning operation is performed, accelerates the creation of the unique microstructure within the exposed copper film surface. The roughened microstructure so produced includes an extremely large micro-surface area. This spin off process and etching operation also exposes high crystallographic index planes in the plated copper film.

After the spin off and etching operation, the substrate is submerged again into the electroplating solution. Before electroplating current is applied, however, the substrate is re-introduced into the plating solution. The substrate may remain stationary or it may be rotated using a rotation rate of 5 to 400 rpm. In the preferred embodiment, the rotation rate may range from 10 to 90 rpm for a period of 2 to 30 seconds. In the preferred embodiment, this "dwell time" will be within the range of 2 to 20 seconds. During this time, the solution may be maintained in an electrically neutral state or a minimal current of 3–5 $mA/cm^2$, which is much less than the electroplating current, may be applied. During this dwell period before the electroplating current is applied, additives from the bath adsorb onto the large micro-surface area and the high crystallographic index planes created by the prior step.

In this manner, an impurity film is laminated onto the first layer of the composite film of the present invention. More specifically, an impurity film is laminated onto the microstructure formed on the surface of this first-deposited film layer. The additives contained in the plating solution are preferentially adsorbed from the solution and onto the copper microstructure during this lamination process. In this manner, a thin film containing an increased impurity content, is laminated onto the microstructure to provide a discrete region of impurity concentration within the composite film structure which is much higher than a corresponding impurity concentration within the bulk film produced by electroplating from the same electroplating solution.

After this brief dwell period during which time impurity film lamination occurs, and while still in the electroplating solution, an electroplating current is again applied to the cathode to form another electrodeposited film, and to continue the film-formation process. The electroplating time is determined by the required total film thickness of the composite film. Through the use of the described operating sequence of plate, spin and etch, dwell, and plate, a film having an increased concentration of impurities such as carbon, $O_2$, sulfur, nitrogen, and chlorine, may be laminated into the composite copper film. Additional impurities such as tin, niobium, indium, titanium, tantalum, tungsten, chromium, and phosphorus may alternatively or additionally be added as laminated impurities according to the above processes.

In the embodiment described above, the composite film consists of a plated film layer with an enhanced microstructure formed on the surface, a laminated film with an increased impurity concentration, and a further plated film layer over the laminated film. This composite film contains a discrete region (the laminated impurity film) of a high concentration of impurities and a roughened microstructure formed between the individual film layers forming the composite. Together these features provide an electromigration-resistant, composite copper film in which grain growth is suppressed. The film provides superior metallurgical, thermo-mechanical, and electrical properties.

In an alternate embodiment, the operating sequence of plate, spin and etch, dwell, and plate may be repeated to increase the total impurity lamination within the composite film. In this manner, the final composite film produced by the process will consist of multiple, individually formed film layers with roughened microstructures and multiple, individually laminated impurity films of high impurity content, between the individual film layers. Because multiple laminated films forming multiple discrete regions of high impurity concentration are present, the overall impurity content within the composite film is increased, relative to an embodiment having only one laminated impurity film.

In another exemplary embodiment of the present invention, when smaller amounts of impurity lamination is desired within a plated film, the duration of the spin and etch operation performed ex-situ (outside of the plating solution) may be reduced accordingly. Without the formation of the high surface area microstructure, less impurity lamination will occur during the subsequent dwell period.

To further reduce impurity lamination, the spin and etch process (which occurs outside of the plating solution) may be disregarded and replaced with a prolonged dwell period within the plating solution. In this alternative embodiment comprising the sequence of: plate, longer dwell time, plate; the dwell times within the etch solution between the application of an electroplating current may range from 10 to 90 seconds. In the preferred embodiment, these dwell times range between 20 to 60 seconds. Using this sequence, the spin and drying operation applied to the substrate between sequentially deposited, individual electroplated films is not necessary.

The impurity content of various additives formed within the electrodeposited, bulk copper film, may be as follows:

TABLE 1

Impurity Concentration in the Plated Film
(in parts per million)

| | Impurity Content | Preferred Impurity Content |
|---|---|---|
| Carbon | 3–120 ppm | 3–75 ppm |
| Oxygen | 0–100 ppm | 0–30 ppm |
| Chlorine | 2–200 ppm | 2–100 ppm |
| Nitrogen | 0–100 ppm | 0–30 ppm |
| Sulfur | 1–60 ppm | 1–15 ppm |

The concentration of impurities within the laminated impurity film, produced on the microsurface within the composite electroplated copper film, may vary from the concentration of the element within the bulk electrodeposited film (as in Table 1), up to sub-monolayer values, but will be significantly greater than that of the bulk, electrodeposited film, in the preferred embodiment. The maximum concentration range of additives such as carbon, oxygen, nitrogen, and sulfur is approximately $1 \times 10^{13}$ to $1 \times 10^{14}$ atoms/cm$^2$. This concentration of impurity additives within the laminated impurity film, is sufficiently high to stabilize the microstructure of the composite plated film to resist grain growth during the time period of interest, but not so high as to cause multi-layer contact resistance problems within the film. In addition to the species listed in the table above, additional impurities such as tin, niobium, indium, titanium, tantalum, tungsten, chromium, and phosphorus may be added as laminated impurities according to the above processes.

The substrate is then annealed. In damascene applications, the annealing step may take place before polishing and formation of the completed structure; in other applications, annealing may take place after formation of the patterned structure. The annealing process takes place in an inert ambient such as hydrogen, forming gas, or nitrogen. The annealing times may range from 3 to 120 minutes, but most preferably within the range of 5 to 90 minutes at temperatures ranging from 70° C. to 450° C. and, most preferably, within the range of 100° C. to 400° C. The annealing time is increased as the annealing temperature is decreased. The annealing process produces a highly desirable, twinned grain structure. The twinned grains abut each other, preventing any significant further grain growth or metal recovery.

Now turning to the drawing, FIGS. 1A and 1B through 7A and 7B depict the sequence of process steps of the present invention used to form two different embodiments of semiconductor devices. FIGS. 1A, 2A, 3A, 4A, 5A, 6A, and 7A are cross-sectional views showing the process of the present invention used to form a metal wire on a semiconductor surface in which a photosensitive patterned film is used to produce a wiring pattern. FIGS. 1B, 2B, 3B, 4B, 5B, 6B, and 7B are cross-sectional views showing the process sequence of the present invention used to form a wiring pattern within a trench using a damascene process.

Figure 1A:
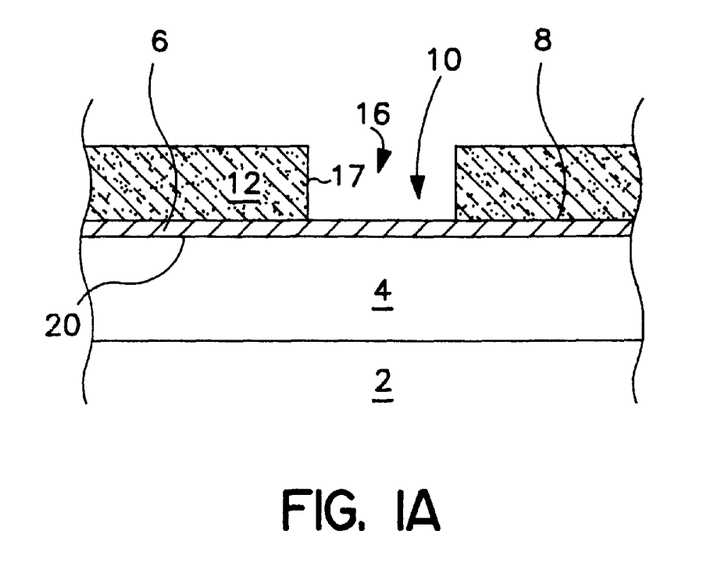
FIG. 1A is a cross-sectional view of an exemplary embodiment of a plating base formed on a semiconductor substrate.
Figure 1B:
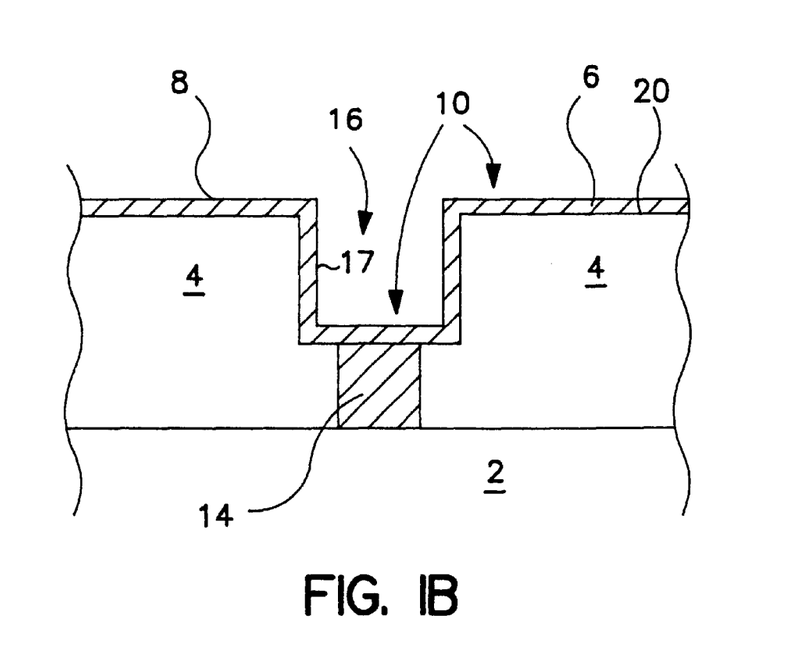
FIG. 1B is a cross-sectional view of an exemplary embodiment of a plating base formed within a damascene trench on a semiconductor substrate.

FIGS. 1A and 1B represent the first step in the processing sequence used to form the composite metal film of the present invention. Both FIGS. 1A and 1B show cross-sections of a substrate with a seed layer onto which the composite film of the present invention will be formed. Referring now to both figures, dielectric or insulating layer 4 is disposed upon substrate 2. Plating base or seed layer 6 is formed on the dielectric 4 and includes a top surface 8. The exposed region 10 of the top surface 8 of the electroplating seed layer 6 is the region onto which an electroplated film will be deposited. Trench 16, which includes side walls 17, is the region in which the final composite electroplated metal film will be formed. Dielectric 4 has an upper surface 20.

Now referring to FIG. 1A, the exposed region 10 is defined by a photolithographically sensitive film 12. Photolithographically sensitive film 12 is patterned by photolithography, whereby exposed region 10 of the top surface 8 of seed layer 6 is exposed. A cavity or trench 16 is formed within patterned sections of photolithographically sensitive film 12. The composite metal film of the present invention will be formed on top of upper surface 20 and within trench 16. The final composite electroplated film will be achieved after photolithographically sensitive film 12 is removed in subsequent processes.

Now turning to FIG. 1B, trench 16 is formed to extend downward from upper surface 20 of dielectric 4. The structure using the composite metal film of the present invention will be formed ultimately within trench 16 using damascene techniques. Although the invention is described in conjunction with a single damascene structure shown in FIG. 1A, it is understood that the present invention may be formed within a dual damascene or other inlaid structure. It can be seen that exposed region 10 comprises the entire top surface 8 of the seed layer 6. In this manner, electroplated films will be successively deposited over the entire top surface 8 during subsequent processing operations. Via 14 provides electrical connection through the substrate 2 and to the damascene line which will be formed.

Figure 2A:
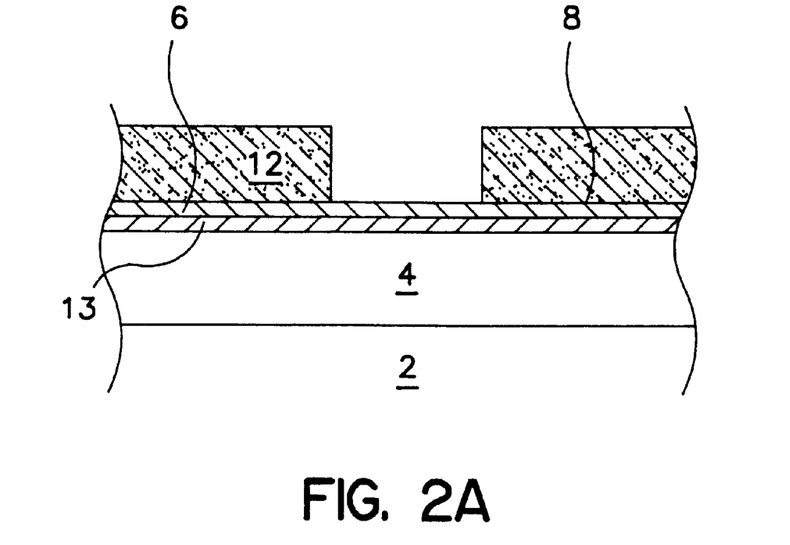
FIG. 2A is a cross-sectional view of another exemplary embodiment of a plating base formed on a semiconductor substrate.
Figure 2B:
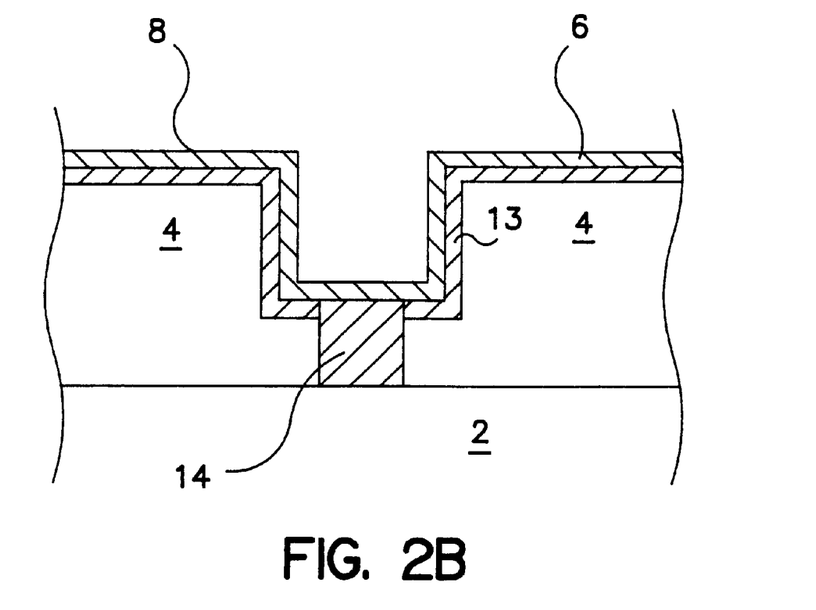
FIG. 2B is a cross-sectional of another exemplary embodiment of a plating base formed within a trench on a semiconductor substrate.

FIGS. 2A and 2B are cross-sections showing an alternative embodiment of each of the two devices shown in FIGS. 1A and 1B. In each case, a barrier material 13 (metal) is formed on the dielectric 4 and substrate 2 before the formation of seed layer 6. In this manner, a barrier material 13 is interposed between the dielectric 4 and the plating base or seed layer 6.

Figure 3A:
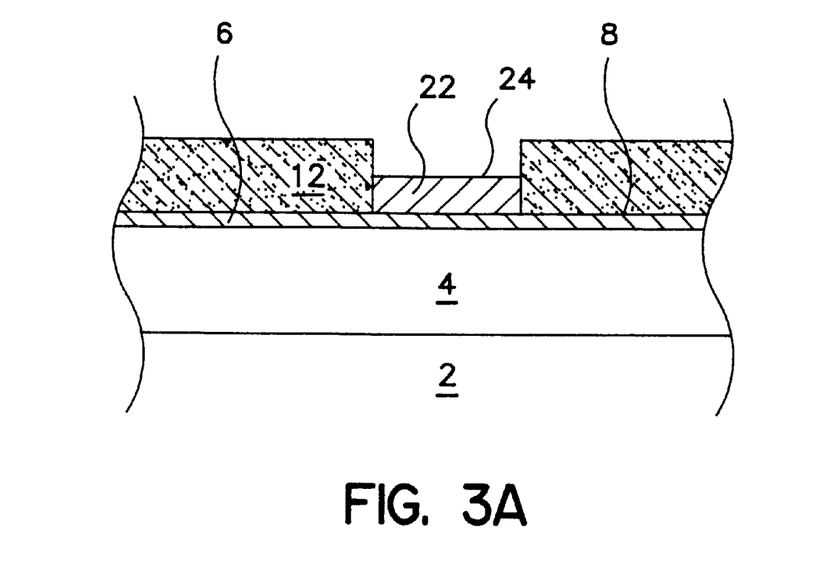
FIG. 3A is a cross-sectional view showing the structure of FIG. 1A after an electrodeposited film has been added.
Figure 3B:
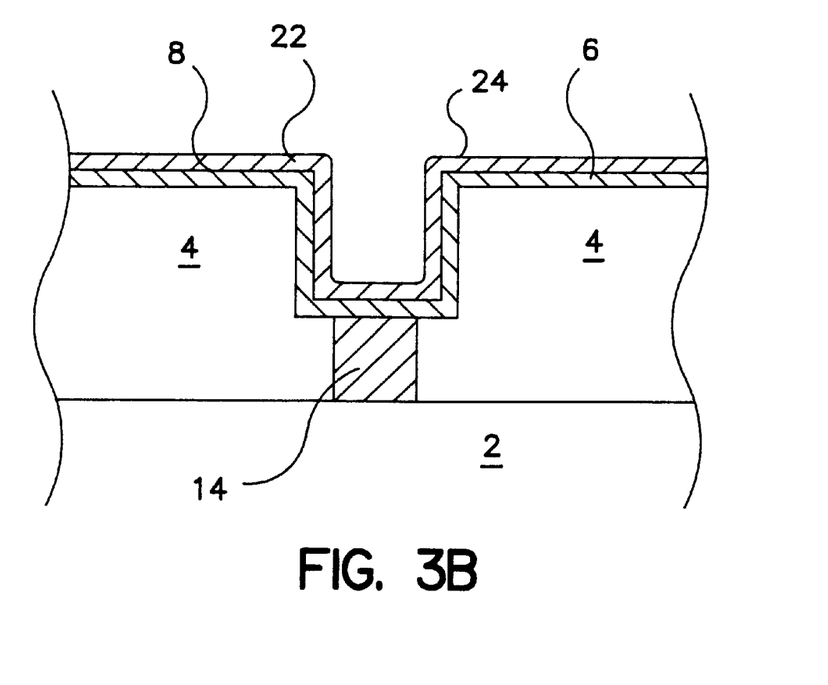
FIG. 3B is a cross-sectional view showing the structure of FIG. 1B after an electrodeposited film has been added.
Figure 4A:
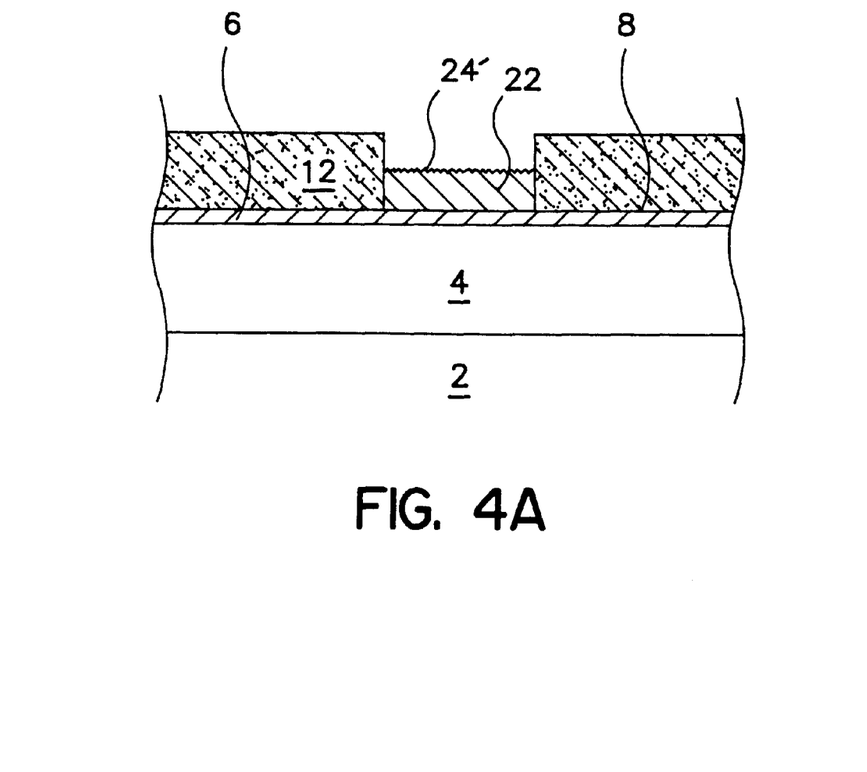
FIG. 4A is a cross-sectional view showing the roughened micro-surface of the electrodeposited film of FIG. 3A.
Figure 4B:
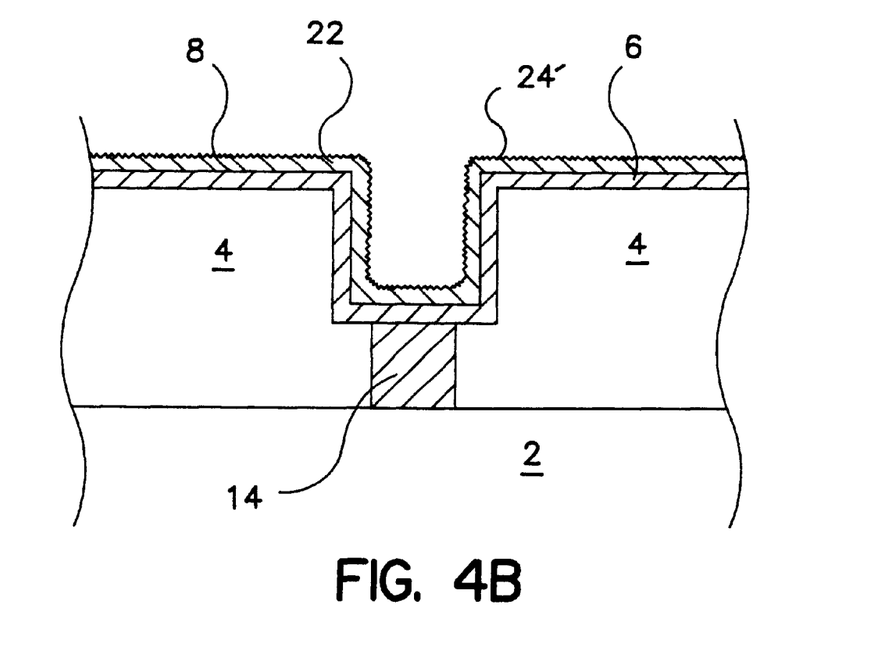
FIG. 4B is a cross-sectional view showing the roughened micro-surface of the electrodeposited film of FIG. 3B.

Now turning to FIGS. 3A and 3B, the following step in the processing sequence is shown as applied to the structures originally shown in FIGS. 1A and 1B. In FIGS. 3A and 3B, a first electrodeposited metal film layer 22 is formed on the exposed regions 10 of the top surface 8 of the metal seed layer 6. First electrodeposited metal film layer 22 may be a copper film according to the preferred embodiment of the present invention. The first electrodeposited metal film layer 22 includes an upper surface 24. The thickness of first electrodeposited metal film layer 22 will be determined by the device application, the physical geometries of the device onto which it is formed, and the number and thickness of additional film layers (not shown) to be deposited on top of first electrodeposited metal film layer 22 to form the completed composite film structure of the present invention. Now turning to FIGS. 4A and 4B, a roughened surface 24' has been formed of the original surface (feature 24 of FIGS. 3A and 3B), according to the process of the present invention. Roughened surface 24' represents a micro-surface having high crystallographic index planes and a high surface area on a microscopic scale. Roughened surface 24' is formed as a result of the process of the present invention as described above.

Figure 5A:
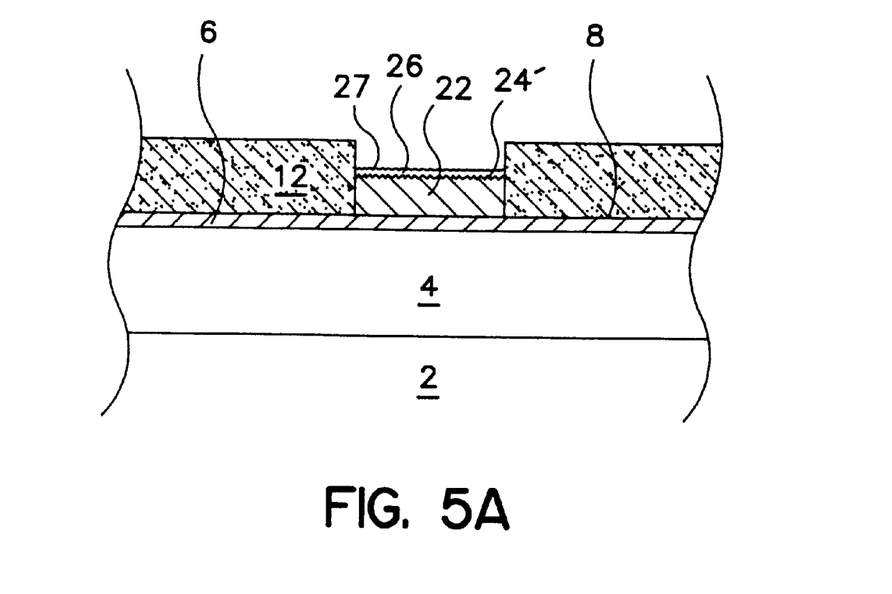
FIG. 5A is a cross-sectional view showing an impurity film laminated onto the roughened micro-surface of FIG. 4A.
Figure 5B:
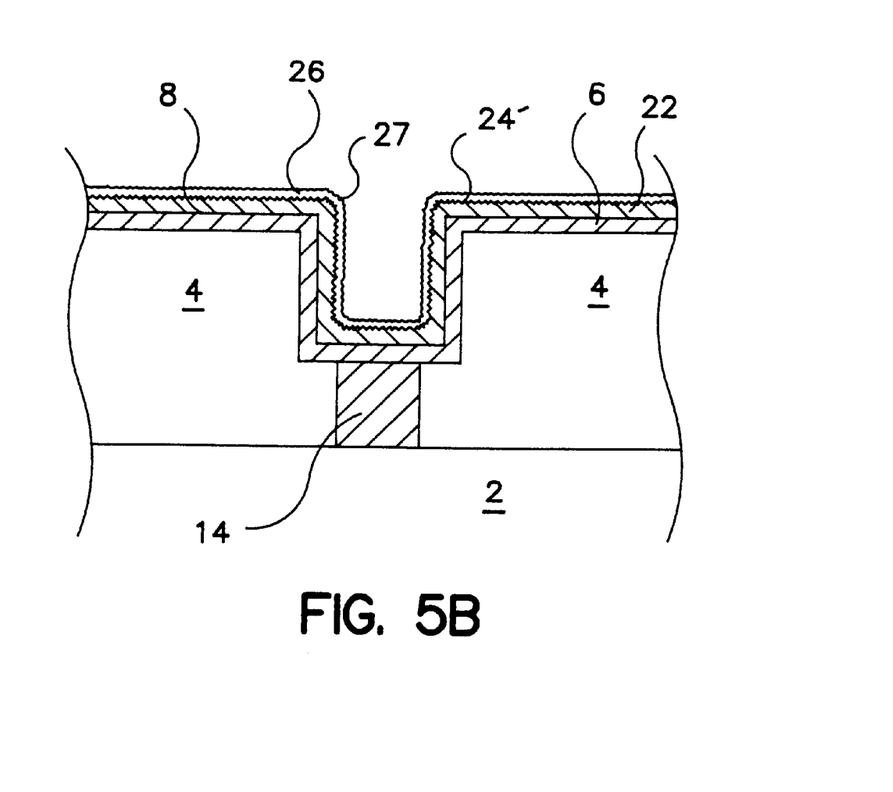
FIG. 5B is a cross-sectional view showing an impurity film laminated onto the roughened micro-surface of FIG. 4B.

Now turning to FIGS. 5A and 5B, the following step in the processing sequence is shown. A laminated impurity film 26 is formed on the microstructure comprising roughened surface 24'. Laminated impurity film 26 has a top surface 27 and is comprised of a high concentration of impurity additives from the electroplating bath as described above. The thickness of laminated impurity film 26 may be as thin as a sub-monolayer. Laminated impurity film 26 is comprised of an impurity film which laminates onto the roughened microsurface from a plating solution, as described above. This laminated impurity film 26 contains a significantly increased concentration of impurity additives, relative to that of the bulk film produced by electrodeposition.

Figure 6A:
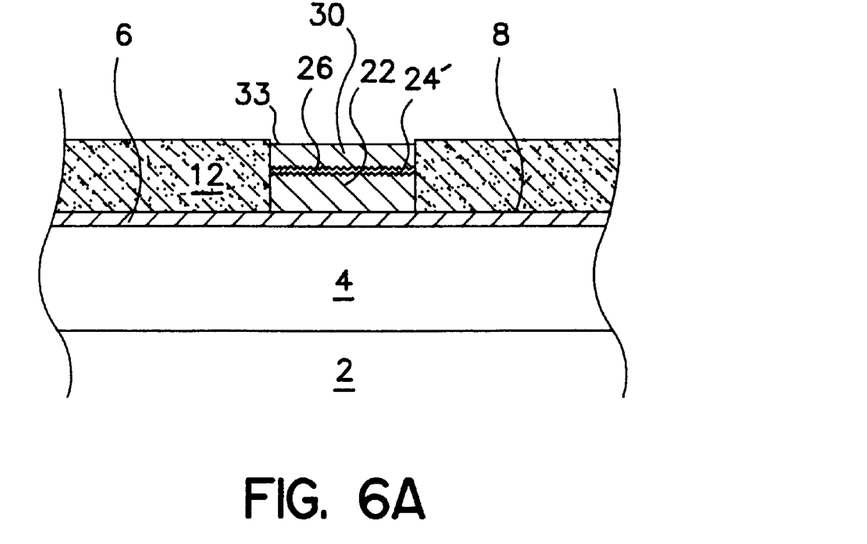
FIG. 6A is a cross-sectional view showing an additional film electrodeposited onto the structure of FIG. 5A.
Figure 6B:
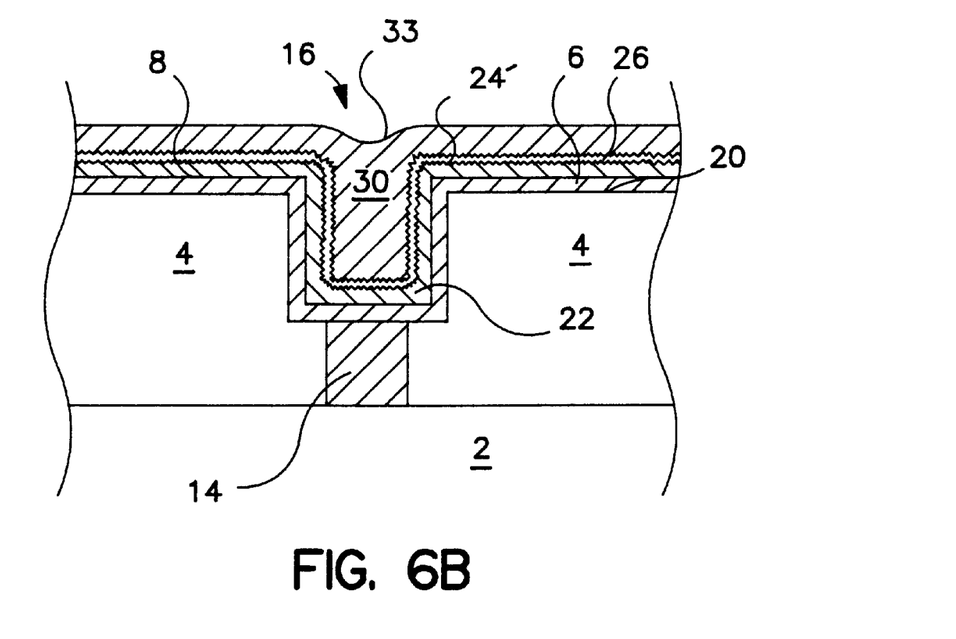
FIG. 6B is a cross-sectional view showing an additional film electrodeposited onto the structure of FIG. 5B.

Now turning to FIGS. 6A and 6B, a second electrodeposited metal film layer 30 is formed on the top surface 27 of the laminated impurity film 26. Second electrodeposited metal film layer 30 is formed according to the electrodeposition process as described above and has a top surface 33. In this exemplary embodiment of the present invention, a composite film of two separately and individually formed metal film layers 22, 30 is produced.

In FIG. 6A, the composite film is formed within the trench 16. Referring to FIG. 6B, it can be seen that second electrodeposited metal film layer 30 fills trench 16 and also is formed above upper surface 20 of dielectric 4. It can be seen that films 26 and 22 are also formed above upper surface 20 in FIG. 6B.

Figure 7A:
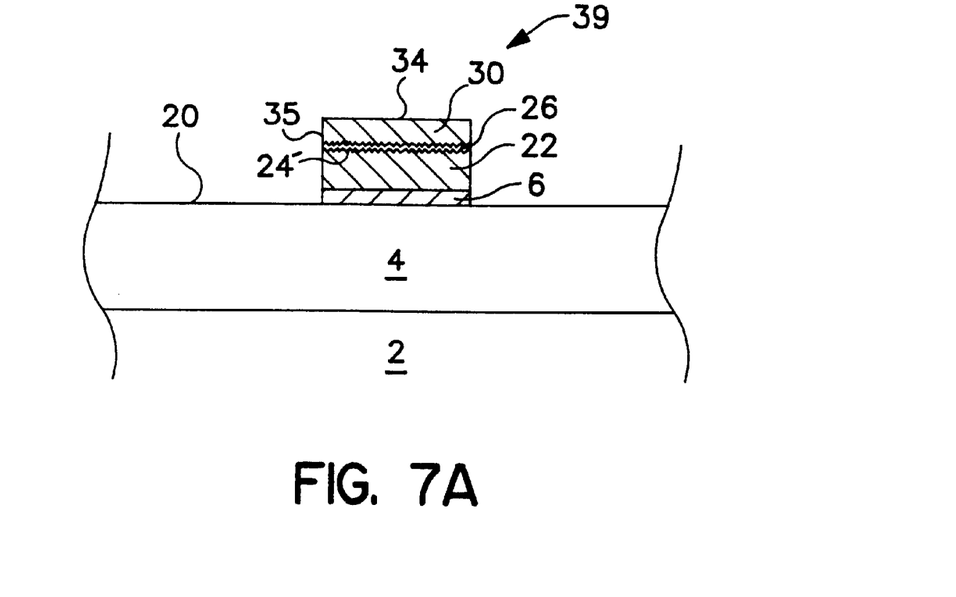
FIG. 7A is a cross-sectional view showing the surface metal line formed according to the present invention.

Now turning to FIG. 7A, which illustrates the final step in the process sequence for the metal line formed completely above upper surface 20, composite metal conductive line 39 can be seen. The photolithographically sensitive film (film 12 of FIGS. 1A through 6A) has been removed to produce composite metal conductive line 39 having a top surface 34 and side walls 35. The photolithographically sensitive film may be removed by any process suitable in the art.

Composite metal conductive line 39 includes an electroplating seed layer 6, a first electrodeposited metal film layer 22, and a second electrodeposited metal film layer 30. Interposed between the first and second electrodeposited metal film layers lies a laminated impurity film 26 which is formed on roughened surface 24' of first electrodeposited metal film layer 22. Laminated impurity film 26 provides a discrete region of increased impurity concentration. This high-concentration impurity region, together with roughened micro surface 24', provides the qualities of grain growth suppression and electromigration resistance to composite metal conductive line 39.

Composite metal conductive line 39 is formed completely on top of upper surface 20 of dielectric 4 and over substrate 2. After the photolithographically sensitive film 12 is removed, composite metal conductive line 39 may be annealed, as described above, to produce a highly twinned, stable grain microstructure. The composite metal conductive line 39 is highly electromigration-resistant, suppresses grain growth, and has superior electrical, thermo-mechanical, and metallurgical properties.

Figure 7B:
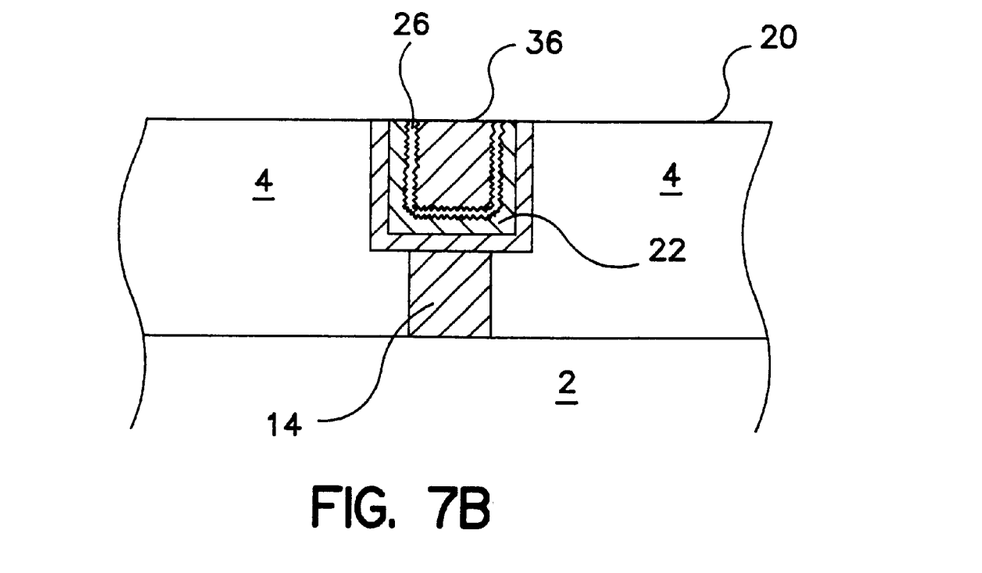
FIG. 7B is a cross-sectional view showing the damascene metal line formed according to the present invention.

The composite film of the present invention may also be inlaid within an opening formed within a dielectric or other material. FIG. 7B shows the final composite electroplated film formed in a damascene structure. Portions of films 22, 26, and 30, which were formed above upper surface 20 of dielectric 4, have been removed. The process for removal may be any polishing procedure common to the art. In the preferred embodiment, CMP (chemical mechanical polishing) may be used. After the excess films are removed from upper surface 20, composite film structure 40 is produced having a top surface 36.

Composite film structure 40 includes seed layer 6, first electrodeposited metal film layer 22, and second electrodeposited metal film layer 30. Interposed between the first electrodeposited metal film layer 22 and the second electrodeposited metal film layer 30 is the laminated impurity film 26. Laminated impurity film 26 provides a discrete, high-concentration impurity region. This high-concentration impurity region, together with roughened micro surface 24', provides the qualities of grain growth suppression and electromigration resistance to composite film structure 40. In the preferred embodiment, an anneal process, as described above, may be used before CMP removal of the composite film from upper surface 20. The annealing process may cause grain growth between seedlayer 6 and first electrodeposited metal film layer 22, effectively merging the two films.

Although the invention is illustrated and described above with reference to specific embodiments, the invention is not intended to be limited to the details shown. Rather, various modifications may be made in the details within the scope and range of equivalents of the claims and without departing from the invention. It will be understood by one skilled in the art, for example, that the present invention contemplates various embodiments of the composite film in addition to the exemplary embodiment of the composite film described above. The composite film may consist of three or more separately electrodeposited metal film layers. Interposed between the electrodeposited metal film layers, and on the roughened microstructures formed on their exposed surfaces, various and multiple impurity films may be laminated. The composite film may be formed on top of a surface or it may be inlaid.

The composite films produced in accordance with the present invention may find use in various applications in which an electromigration-resistant, conductive copper film is sought. The semiconductor structures detailed above are intended to be exemplary only. Various additional applications, both within the semiconductor industry and other fields, may benefit from the composite films of the present invention. The films would be desirable for most "back end of line" applications.

The details of the processes used to form the structures of the present invention may also differ, from the process parameters detailed above, and still remain within the scope of the present invention. Furthermore, the final film structure may be varied and remain within the scope of the present invention.

What is claimed:

1. An electrodeposited copper film structure formed on a substrate surface, comprising:

a plurality of sequentially electrodeposited buried copper-containing films, each including a surface with a roughened microstructure; and a plurality of impurity microfilms, each formed on a corresponding roughened microstructure of said plurality of copper-containing films, wherein each said impurity microfilm of said plurality of impurity microfilms is disposed between a set of buried copper-containing films of said plurality of sequentially electrodeposited buried copper-containing films; and an upper electrodeposited copper-containing film.

2. The electrodeposited copper film structure as in claim 1, wherein said plurality of impurity microfilms are formed by lamination.

3. The electrodeposited copper film structure as in claim 2, wherein each impurity microfilm of said plurality of impurity microfilms includes copper and a dopant impurity having a corresponding impurity concentration.

4. The electrodeposited copper film structure as in claim 3, wherein said dopant impurity comprises at least one of carbon, oxygen, nitrogen and sulfur.

5. The electrodeposited copper film structure as in claim 2, wherein said lamination comprises maintaining said substrate surface in an electroplating solution containing impurity additives, with an electroplating cathode maintained in a electrically neutral state.

6. The electrodeposited copper film structure as in claim 3, wherein said dopant impurity comprises at least one of Sn, In, Ti, W, Ta, Nb, Cr, and P.

* * * * *